(12) United States Patent
Wasaki et al.

(10) Patent No.: US 7,405,574 B2
(45) Date of Patent: Jul. 29, 2008

(54) SIGNAL DETECTOR

(75) Inventors: Masaru Wasaki, deceased, late of Ichihara (JP); by Hitomi Wasaki, legal representative, Ichihara (JP); Yoshihiro Saitoh, Tokyo (JP)

(73) Assignee: TDK Corporation, Tokyo (JP)

( * ) Notice: Subject to any disclaimer, the term of this patent is extended or adjusted under 35 U.S.C. 154(b) by 86 days.

(21) Appl. No.: 10/586,949

(22) PCT Filed: Jan. 26, 2005

(86) PCT No.: PCT/JP2005/000968

§ 371 (c)(1),
(2), (4) Date: Nov. 8, 2006

(87) PCT Pub. No.: WO2005/072071

PCT Pub. Date: Aug. 11, 2005

(65) Prior Publication Data

US 2007/0268063 A1 Nov. 22, 2007

(30) Foreign Application Priority Data

Jan. 30, 2004 (JP) .............................. 2004-024869

(51) Int. Cl.
G01R 29/26 (2006.01)
G01R 27/28 (2006.01)
G01R 23/20 (2006.01)

(52) U.S. Cl. ..................... 324/613; 324/612; 324/620

(58) Field of Classification Search ................. 324/613, 324/612, 620
See application file for complete search history.

(56) References Cited

U.S. PATENT DOCUMENTS

| 7,285,962 | B2 * | 10/2007 | Bogdanski et al. | .......... 324/603 |
| 2002/0147555 | A1 | 10/2002 | Nagata et al. | |
| 2003/0095036 | A1 * | 5/2003 | Wasaki et al. | .......... 340/310.01 |
| 2005/0285693 | A1 * | 12/2005 | Wasaki et al. | .................. 333/12 |

FOREIGN PATENT DOCUMENTS

| JP | U 60-64269 | 5/1995 |
| JP | A 2000-314756 | 11/2000 |
| JP | A 2002-231813 | 8/2002 |

* cited by examiner

*Primary Examiner*—Vincent Q. Nguyen
*Assistant Examiner*—Amy He
(74) *Attorney, Agent, or Firm*—Oliff & Berridge, PLC

(57) ABSTRACT

A signal suppression filter (22) that inhibits high-frequency signals contained in power voltage and a signal separation filter (23) that prevents transmission of the high-frequency signals are provided in series on power lines (21A), (21B) connected to a power input terminal (T1), and a common-mode signal detection circuit (25) and a normal-mode signal detection circuit (26) are provided separately from each other. While bi-directionally blocking transmission of a high-frequency signal (noise) between the power supply and the device to be measured by the signal suppression filter (22) and the signal separation filter (23), the common mode signal and the normal mode signal generated in the device to be measured (3) and entering through a power output terminal (T2) are detecting separately. The analysis of the cause of occurrence of a high-frequency signal produced in the device to be measured (3) is facilitated, and proper noise countermeasure may be taken.

10 Claims, 12 Drawing Sheets

SIGNAL DETECTOR

TECHNICAL FIELD

The present invention relates to a signal detector used for measuring high-frequency signal voltage (noise) induced in power terminals of various electric devices.

BACKGROUND ART

Recently, a large number of electric devices have been used in homes or companies, and along with this, a problem of adverse influence of electro-magnetic interference (EMI) noise on other electronic devices arises. Such EMI noise is largely classified into two types. One is conducted interference transmitted through a power line and another is radiated interference directly radiated from devices. As one of methods for evaluating the conducted interference of them, a noise terminal voltage test is given. The test is for measuring high-frequency noise signal voltage induced in a power voltage terminal of an electric device.

Various countries have established strict standards on the noise terminal voltage. For example, there are standards such as CISPR (International Special Committee on Radio Interference) as an international standard, FCC (Federal Communications Commission) in the United States, and VCCI (Voluntary Control Council for Interference by Information Technology) in Japan. For example, CISPR22 defines a strict standard value for a wide frequency band of 150 kHz to 30 MHz. In accordance with this, it has been performed that a measuring device for the noise terminal voltage as shown in FIG. 18 has been set in a radio wave anechoic chamber to measure conformity to standards.

FIG. 18 shows a noise-terminal-voltage measuring system used for measurement of conformity to standards. In the system, power voltage from commercial power is supplied to a simulated power circuit network 101C in a measuring device 101 via a power cable 100C (here, a pair of power lines and a ground line are shown by a single thick-line), and in turn supplied to a device to be measured 102 via power lines 101A, 101B and a ground line 101G. Noise generated by the device to be measured 102 is measured by a spectrum analyzer 103. The simulated power circuit network 101C is inserted between the device to be measured 102 and a power source. The network 101C is for supplying power while keeping impedance seen from a power terminal of the device to be measured 102 to a defined value (50 to 150 Ω), and isolating a measuring circuit from external noise at a power source side, which is a signal detector indispensable for accurately detecting a noise signal generated in the device to be measured 102.

The measuring device 101 has a switch 101S, and can selectively measure noise at a power line 101A side or noise at a power line 101B side by changing the switch 101S.

FIG. 19 shows an example of a specific circuit of the measuring device 101. The circuit is described, for example, in a connection diagram of the simulated power circuit network KNW-242C manufactured by KYORITSU CORP.

The measuring device 101 has a power input terminal J1, power output terminal J2, and signal output terminal J3. A simulated power circuit network 101C is provided on power lines 101A, 101B between the power input terminal J1 and the power output terminal J2. The simulated power circuit network 101C has inductance elements L1 and L3 connected in series inserted into the power line 101A, and inductance elements L2 and L4 connected in series inserted into the power line 101B.

The inductance element L1 is connected to ground at a side of the power input terminal J1 via a resistor R1 and via a capacitor C1 and a resistor R3 connected in series. A connection point between the inductance elements L1 and L3 is connected to ground via a capacitor C3 and a resistor R5 connected in series, and the inductance element L3 is connected to ground at a side of the power output terminal J2 via a capacitor C5 and a resistor R7 connected in series.

The inductance element L2 is connected to ground at a side of the power input terminal J1 via a resistor R2 and via a capacitor C2 and a resistor R4 connected in series. A connection point between the inductance elements L2 and L4 is connected to ground via a capacitor C4 and a resistor R6 connected in series, and the inductance element L4 is connected to ground at a side of the power output terminal J2 via a capacitor C6 and a resistor R8 connected in series.

A connection point P1 between the capacitor C5 and the resistor R7 and a connection point P2 between the capacitor C6 and the resistor R8 are connected to the switch 101S, and one of noise signals from the connection points P1, P2 appears at a signal output terminal J3, and the other is connected to ground in response to change of the switch 101S.

In the simulated power circuit network 101C, when the power line 101A is noted, an LC filter including the inductance elements L1, L3 and the capacitors C1, C3 is configured, and when the power line 101B is noted, an LC filter including the inductance elements L2, L4 and the capacitors C2, C4 is configured. The LC filters are configured in a manner that they exhibit high impedance to both noise signals from the power input terminal J1 and from the power output terminal J2, thereby while they transmit low-frequency AC voltage, the power input terminal J1 is isolated from the power output terminal J2 with respect to a high-frequency noise signal.

An air-core coil, which is configured without inserting a core into a coil, is used for the inductance elements L1, L3 and the inductance elements L2, L4 in order to make a frequency characteristic to be flat to a high frequency band (that is, in order to enable signal separation independently of frequencies). This is because if the coil has the core, a signal separation characteristic has frequency dependence.

From the consideration of recent social environment about noise, the following points are given.
1) Energy saving by a top runner method is promoted.
2) Harmonic distortion in a power line becomes problematic; therefore a countermeasure circuit for harmonics is generally mounted.
3) Power for some home electric appliances including plasma display tend to be significantly increased.
4) In addition to information devices, home electric appliances are generally controlled by a microprocessor.
5) In addition to a noise problem due to rotational electric devices such as an electric tool, a problem of switching noise is actualized in a lighting fixture, an air conditioner and the like because of introduction of inverter control.

In this way, recently noise generated by the electric devices tends to increase particularly due to increase in switching control of a power source of a device, increase in number of primary phase control circuit, and furthermore multiplexing of a switching circuit. Therefore, to examine whether the noise meets the standard, necessity of measurement of the noise terminal voltage using the measuring system as shown in FIG. 18 is increased larger and larger.

Such noise terminal voltage includes a common mode (noise) signal and a normal mode (noise) signal. The common mode signal is transmitted over two conductive lines (for example, a pair of power lines) in the same phase, and the normal mode signal is transmitted by two conductive lines and generates potential difference between the two conductive lines. In many cases, amplitude or a frequency band of each mode of the signals varies depending on a circuit configuration of an electric device as a measuring object.

However, while the measuring device as shown in FIG. 18 takes the noise terminal voltage as the measuring object, it measures the common mode signal and the normal mode signal together (in a mixed manner). Therefore, signals may not be separated to be measured for each mode, and therefore the amount of information is insufficient for detail and accurate cause analysis of noise, consequently countermeasure for noise need to be performed with trial and error. Therefore, there has been a drawback that long experience and much time and effort are necessary for the countermeasure for noise; consequently development cost is increased in developing a new electric product.

DISCLOSURE OF THE INVENTION

It is firstly desirable to provide a signal detector having an excellent measurement capability that enables simple and accurate cause analysis of noise generation. Moreover, it is secondly desirable to provide a small and inexpensive signal detector that can be easily used as a development tool for development engineers of electric devices while keeping such an excellent measurement capability.

The signal detector of the invention includes: a power input terminal supplied with power voltage from a power supply source; a power output terminal connected to a device to be measured, and outputting the power voltage inputted from the power input terminal to a device to be measured; a signal blocking circuit provided on first and second conductive lines connected to the power input terminal, and blocking transmission of a signal between the power input terminal and the power output terminal; a common-mode signal detection circuit extracting a common mode signal from signals contained in the power voltage between the power output terminal and the signal blocking circuit; a normal-mode signal detection circuit extracting a normal mode signal from the signals contained in the power voltage between the power output terminal and the signal blocking circuit; a common-mode signal output terminal provided at an output end of the common-mode signal detection circuit; and a normal-mode signal output terminal provided at an output end of the normal-mode signal detection circuit.

In the signal detector, transmission of the common mode signal and the normal mode signal contained in the power voltage inputted from the power input terminal to a measurement system (signal detection circuit side) is blocked by the signal blocking circuit. The common mode signal and the normal mode signal generated in the device to be measured enter the first and second conductive lines from the power output terminal, but transmission of the signals to a side of the power input terminal side is blocked by the signal blocking circuit. Among the signals entered from the power output terminal, the common mode signal is extracted by the common-mode signal detection circuit, and outputted from the common-mode signal output terminal. Among the signals entered from the power output terminal, the normal-mode signal is extracted from the normal-mode signal detection circuit, and outputted from the normal-mode signal output terminal. As a result, each of the common mode signal and the normal mode signal is separately detected.

The signal detector of the invention may further include a first switch provided at an input end of the common-mode signal detection circuit, and a second switch provided at an input end of the normal-mode signal detection circuit. Moreover, it may still further include a mixed-signal output terminal outputting the common mode signal and the normal mode signal contained in the power voltage between the power output terminal and the signal blocking circuit in a mixed condition.

In the signal detector of the invention, the normal-mode signal detection circuit preferably includes a first high-pass filter blocking the power voltage, and a common-mode signal cancellation circuit removing the common mode signal from signals transmitted through the high-pass filter. In this case, it is possible that the common-mode signal cancellation circuit includes a first mutual-inductance element provided between the first and second conductive lines and generating mutual inductance between the first and second conductive lines; a detection-inversion circuit provided between the first and second conductive lines, and detecting the common mode signal contained in the power voltage inputted from the power input terminal and inverting a phase of the common mode signal; and an injection circuit injecting an inversion signal into the first mutual-inductance element, a phase of the inversion signal having been inverted by the detection-inversion circuit. Here, the following configuration can be made: the first mutual-inductance element includes a first winding inserted into the first conductive line, and a second winding inserted into the second conductive line and coupled with the first winding; the injection circuit includes a third winding coupled with the first mutual-inductance element such that mutual inductance is generated between the third winding and the first mutual-inductance element; the detection-inversion circuit includes first and second capacitors connected in series between the first and second conductive lines; and the third winding is connected to a mutual connection point between the first and second capacitors at one end and connected to ground at the other end. Furthermore, the common-mode signal cancellation circuit preferably includes a second mutual-inductance element, which acts as an impedance element to the common mode signal, on first and second conductive lines between the detection-inversion circuit and the injection circuit.

In the signal detector of the invention, the common-mode signal detection circuit preferably includes a second high-pass filter that transmits only signals, and a normal-mode signal cancellation circuit that removes the normal mode signal from signals transmitted through the high-pass filter. In this case, the normal-mode signal cancellation circuit can be configured to include a third mutual-inductance element provided on the first and second conductive lines and generating mutual inductance between the first and second conductive lines; a detection-inversion-injection circuit connected to the first conductive line, and detecting the normal mode signal contained in the power voltage on the first conductive line, inverting a phase of the normal mode signal detected and injecting an inversion signal, a phase of which has been inverted, into the first conductive line via the third mutual-inductance element; and an impedance element provided on the first conductive line between a connection point of the detection-inversion-injection circuit to the first conductive line and the third mutual-inductance element, and reducing a crest value of the normal mode signal. Here, the following configuration can be made: the third mutual-inductance element includes a fourth winding inserted into the first conductive line, and a fifth winding connected to the second conductive line at one end and mutually coupled with the fourth winding; the detection-inversion-injection circuit includes a third capacitor connected between the first conductive line and the other end of the fifth winding line; and the impedance element includes a sixth winding inserted into the first conductive line.

Meanings of the words in the invention are as follows.

The "signal" is noise if it is unnecessary or harmful. The "common mode signal" is a signal transmitted over two conductive lines in the same phase; and the "normal mode signal" is a signal transmitted by two conductive lines and generates potential difference between the two conductive lines.

The "power supply source" is a power source for supplying power voltage, and typically corresponds to commercial power. However, a power source by private power generation is also included. Although the power voltage is typically AC voltage, it may be DC voltage. The "device to be measured" is an electric device that is a measuring object as a signal source.

The "signal blocking circuit" is a filter that transmits the power voltage, but blocks transmission of the signal. The "common-mode signal output terminal" "normal-mode signal output terminal" and "mixed-signal output terminal" are terminals connected to, for example, a signal meter such as spectrum analyzer.

According to the signal detector of the invention, the signal blocking circuit blocks transmission of a signal between a measurement system (signal detection circuit side) and a power source side, and then the common-mode signal detection circuit extracts the common mode signal among signals generated in the device to be measured and outputs it from the common-mode signal output terminal, and the normal-mode signal detection circuit extracts the normal mode signal among the signals and outputs it from the normal-mode signal output terminal, therefore each of the common mode signal and the normal mode signal can be separately detected. As a result, information for precise and accurate cause analysis of noise generation can be obtained, consequently a development tool for the noise terminal voltage test, which is extremely useful for research and development engineers of power electronics, can be provided.

In particular, when the first switch and the second switch are provided at respective input ends of the common-mode signal detection circuit and the normal-mode signal detection circuit respectively, while one of the circuits is used for measurement, it can be prevented from being adversely affected by the other circuit, therefore a signal level can be detected more accurately.

When the common-mode signal cancellation circuit is used to configure the normal-mode signal detection circuit, or the normal-mode signal cancellation circuit is used to configure the common-mode signal detection circuit, since decrease in size and weight of the circuit can be achieved compared with a case using an LC resonance circuit, a signal detector having portability that allows the detector to be easily used even in any place other than the radio wave anechoic chamber (development field such as laboratory) can be obtained.

When the high-pass filter at a former stage is designed to remove a power frequency component, since only the high-frequency signal can be considered to be removed in designing the common-mode signal cancellation circuit or the normal-mode signal cancellation circuit at a latter stage, further decrease in size of the common-mode signal cancellation circuit or the normal-mode signal cancellation circuit can be achieved, consequently more compact signal detector can be obtained.

When the second mutual-inductance element, which acts as the impedance element to the common-mode signal, is designed to be provided on the first and second conductive lines between the detection-inversion circuit and the injection circuit of the common-mode signal cancellation circuit, the common mode signal can be removed more effectively.

BEST MODE FOR CARRYING OUT THE INVENTION

Hereinafter, the best mode for carrying out the invention (hereinafter, simply called embodiment) will be described in detail with reference to drawings.

Figure 1:
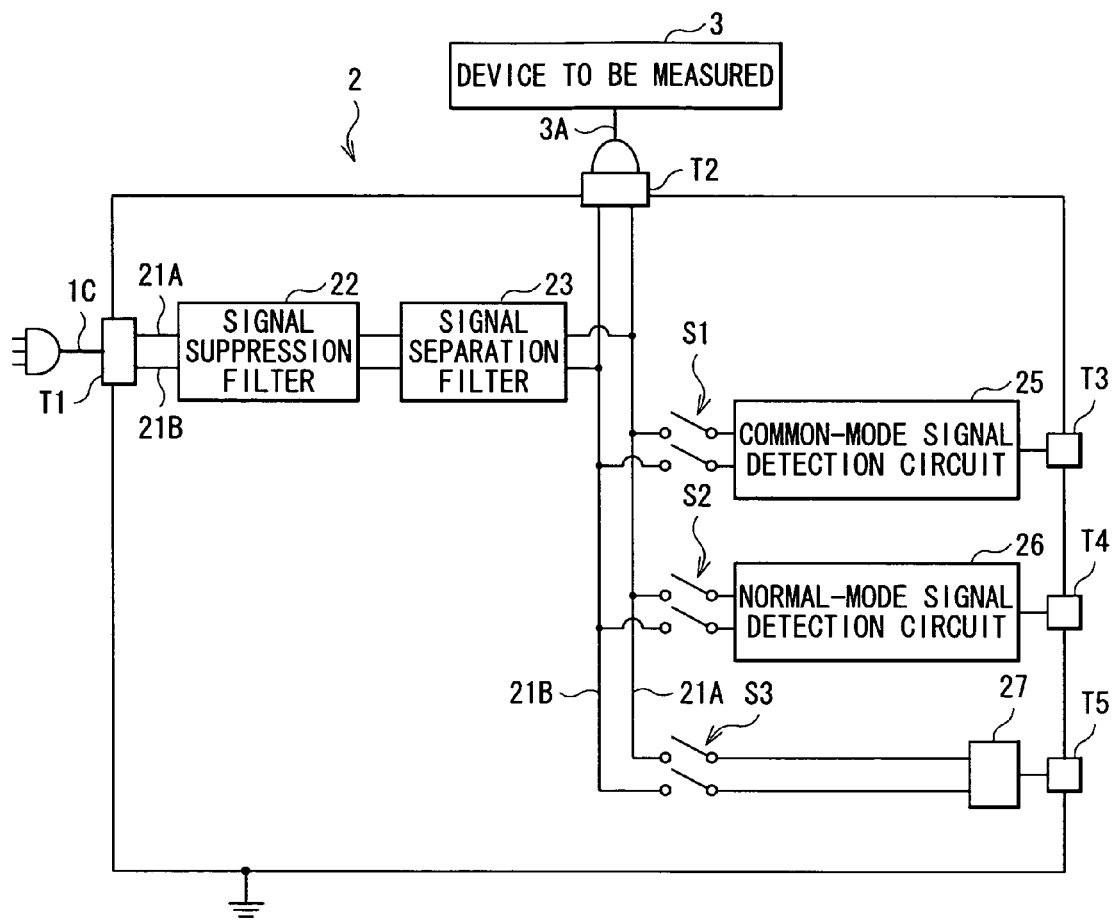
FIG. 1 is a block diagram showing a general configuration of a signal detector according to an embodiment of the invention.

FIG. 1 shows a signal detector according to an embodiment of the invention. The signal detector 2 is a small and portable device having capability of separately detecting the common mode signal and the normal mode signal which are high-frequency signals. The "common mode signal" is a signal transmitted over power lines 21A, 21B described later in the same phase, and the "normal mode signal" is a signal that is transmitted by the power lines 21A, 21B and generates potential difference between the power lines 21A, 21B.

The signal detector 2 has a power cable 1C connected to commercial power, a grounded housing 1A, a power input terminal T1 connected with the power cable 1C, a power output terminal T2 connected with a power cable 3A of a device to be measured 3, and signal output terminals T3 to T5 connected to a signal meter such as not-shown spectrum analyzer. AC voltage from the power input terminal T1 is introduced to the power output terminal T2 by a pair of power lines 21A, 21B and supplied to the device to be measured 3.

The signal detector 2 further includes a signal suppression filter 22 provided on the power lines 21A, 21B connected to the power input terminal T1, a signal separation filter 23 provided on power lines 21A, 21B between the signal suppression filter 22 and the power output terminal T2. Here, the "signal suppression filter 22" and the "signal separation filter 23" correspond to a specific example of a signal blocking circuit in the invention.

The signal detector 2 further includes a common-mode signal detection circuit 25 provided between the power output terminal T2 and the signal output terminal T3, a normal-mode signal detection circuit 26 provided between the power output terminal T2 and the signal output terminal T4, and a line transforming circuit 27 as a balun (balance-unbalance) transformer provided between the power output terminal T2 and the signal output terminal T5. The common-mode signal detection circuit 25 has a switch S1 at an input end (a side of the power output terminal T2), the normal-mode signal detection circuit 26 has a switch S2 at an input end (a side of the power output terminal T2), and the line transforming circuit 27 has a switch S3 at an input end (a side of the power output terminal T2). Here, each of the switches S1, S2 corresponds to a specific example of each of "the first switch" and "the second switch" in the invention. The switch S3 is configured, for example, using a toggle switch or a rotary switch, and can be operated in a non-linked manner to each of lines. Specifically, it is configured that when noise of one line is measured, the other line can be in an open state, in addition, both lines can be in the open state for the case that noise is measured by using the power output terminals T3, T4.

The signal suppression filter 22 is for inhibiting signals contained in power voltage inputted from the power input terminal T1; and the signal separation filter 23 is for preventing transmission of a signal between the power output terminal T2 and the signal suppression filter 22.

In response to closing of the switch S1, the common-mode signal detection circuit 25 extracts the common mode signal from signals contained in power voltage on the power lines 21A, 21B between the power output terminal T2 and the signal separation filter 23, and outputs it from the signal output terminal T3. In response to closing of the switch S2, the normal-mode signal detection circuit 26 extracts the normal mode signal from the signals contained in the power voltage on the power lines 21A, 21B between the power output terminal T2 and the signal separation filter 23, and outputs it from the signal output terminal T4. In response to closing of the switch S3, the line transforming circuit 27 transforms a mixed signal of the common mode signal and the normal mode signal contained in the power voltage on the power lines 21A, 21B between the power output terminal T2 and the signal separation filter 23 into an unbalanced signal, and outputs it from the signal output terminal T5. For example, the circuit 27 is configured similarly to a line transforming circuit (line transforming circuit 257 in FIG. 5 described later) contained in the common-mode signal detection circuit 25. Here, the signal output terminals T3, T4 correspond to specific examples of the "common-mode signal output terminal" and the "normal-mode signal output terminal" in the invention, respectively.

Figure 2:
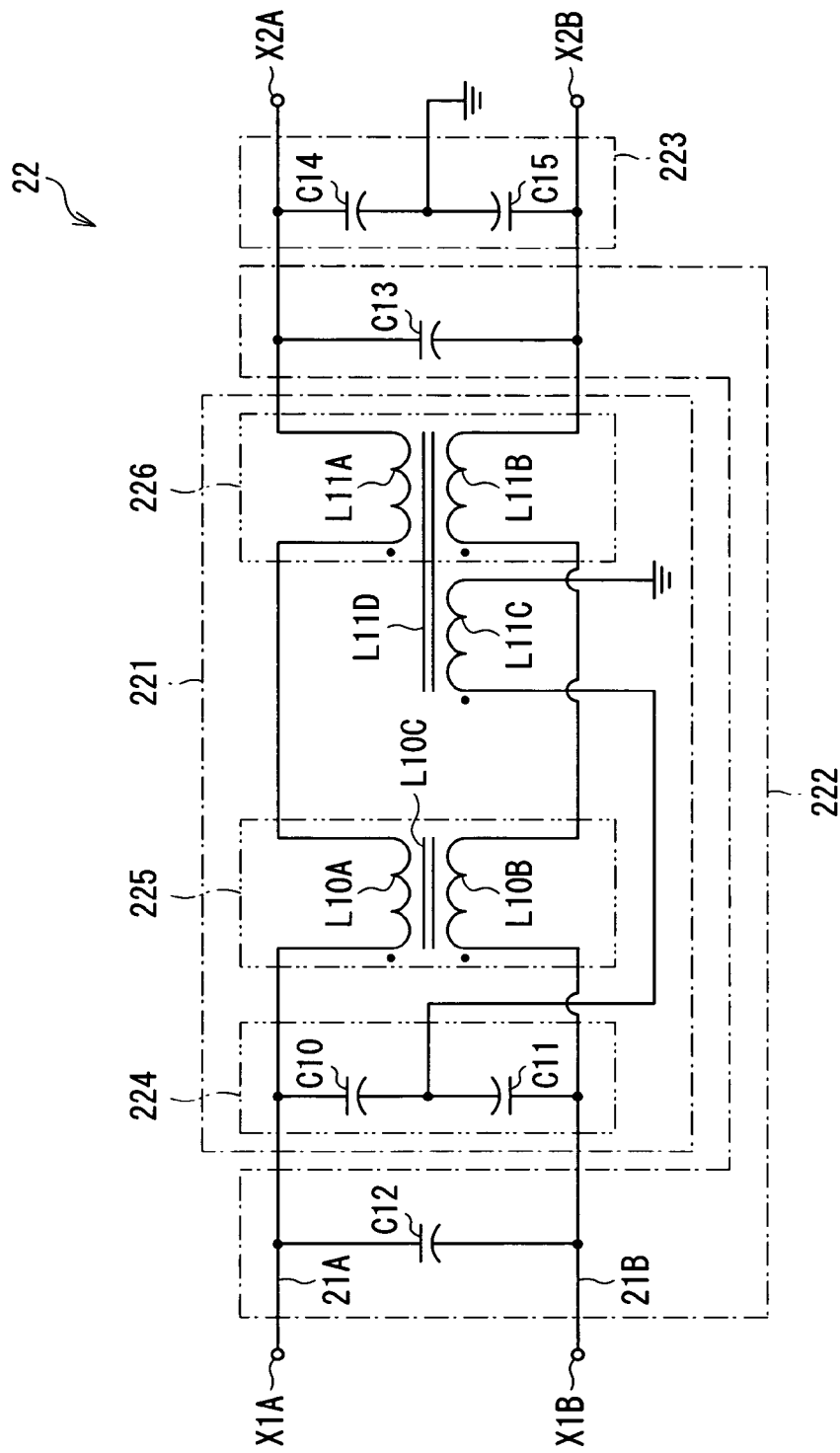
FIG. 2 is a circuit diagram showing a configuration of a signal suppression filter in the signal detector shown in FIG. 1.
Figure 3:
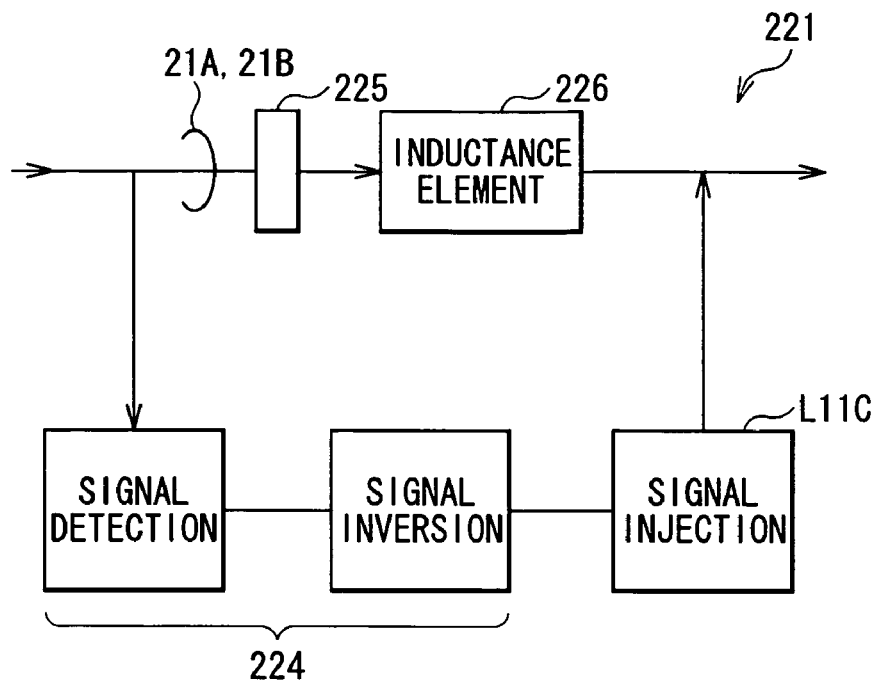
FIG. 3 is a diagram for illustrating a main function of the signal suppression filter shown in FIG. 2.

FIG. 2 shows an example of a circuit configuration of the signal suppression filter 22, and FIG. 3 shows a portion concerning a common-mode signal cancellation circuit 221 among functions of the signal suppression filter 22. The signal suppression filter 22 includes a common-mode signal cancellation circuit 221, normal-mode signal inhibition circuit 222, and common-mode signal inhibition circuit 223 provided between terminals X1A, X1B at a side near the power input terminal T1 and terminals X2A, X2B at a side distant from the power input terminal T1.

The common mode cancellation circuit 221 is configured to include a detection-inversion circuit 224 provided between the power lines 21A, 21B; an inductance element 225 as an impedance element provided on the power lines 21A, 21B adjacently to the detection-inversion circuit 224; an inductance element 226 provided on the power lines 21A, 21B at a side opposite to the detection-inversion circuit 224 with respect to the inductance element 225; and a winding L11C configured such that it generates mutual inductance between the winding and the inductance element 226.

The detection-inversion circuit 224 includes capacitors C10, C11 connected in series between the power line 21A and the power line 21B, and detects the common mode signal contained in the power voltage inputted from the power input terminal T1 and inverts a phase of the signal. Here, the capacitors C10, C11 correspond to a specific example of the "first and second capacitors" in the invention.

The inductance element 225 includes a winding L10A inserted into the power line 21A, winding L10B inserted into the power line 21B, and core L10C, and acts as an impedance element to the common mode signal by generating mutual inductance between the power lines 21A and 21B. Since the inductance element 225 exists, the common mode signal can be attenuated more effectively, and delayed in phase such that phase difference to an inversion signal injected from the detection-inversion circuit 224 into the winding L11C becomes easily 180 degrees.

The inductance element 226 includes a winding L11A inserted into the power line 21A, winding L11B inserted into the power line 21B, and core L11D, and generates mutual inductance between the power lines 21A and 21B. Here, the inductance element 226 corresponds to a specific example of the "first mutual inductance element" in the invention; and the inductance element 225 corresponds to a specific example of the "second mutual inductance element" in the invention. The windings L11A, L11B correspond to a specific example of the "first and second windings" in the invention.

The winding L11C is wound in a manner of using the core L11D in common, and acts as an injection circuit that injects the inversion signal, which is detected and inverted in phase by the detection-inversion circuit 224, into the windings L11A, L11B of the inductance element 226. The winding L10C is connected to a mutual connection point of the capacitors C10 and C11 in the detection-inversion circuit 224 at one end, and connected to ground at the other end. Here, the winding L11C corresponds to a specific example of the "third winding" in the invention.

In the common-mode signal cancellation circuit 221 in such a configuration, the common mode signal transmitted over the power lines 21A, 21B from the terminals X1A, X1B is detected and inverted by the detection-inversion circuit 224, and then injected into the windings L11A, L11B of the inductance element 226 via the winding L11C so that the common mode signals on the power lines 21A, 21B is canceled, thereby the common mode signal can be removed.

The normal-mode signal inhibition circuit 222 includes a capacitor C12 provided between the power lines 21A and 21B between the detection-inversion circuit 224 and the terminals X1A, X1B; and a capacitor C13 provided between the power lines 21A and 21B between the inductance element 226 and the terminals X2A, X2B. The capacitors C12, C13 act as a p-type normal-mode filter that inhibits the normal mode signal in cooperation with leakage inductance of the windings L10A, L10B, L11A and L11B of the inductance elements 225, 226. Here, the capacitors C12, C13 are typically called X capacitor, and correspond to a specific example of the "third and fourth capacitors" in the invention.

The common-mode signal inhibition circuit 223 is configured by capacitors C14, C15 connected in series between the power lines 21A, 21B between the inductance element 226 and the terminals X2A, X2B. A mutual connection point of the capacitors C14 and C15 is connected to ground. The capacitors C14, C15 cooperate with each other to inhibit the common mode signal, particularly in a high frequency band. Here, the capacitors C14, C15 are typically called Y capacitor, and correspond to a specific example of the "fifth and sixth capacitors" in the invention.

Figure 4:
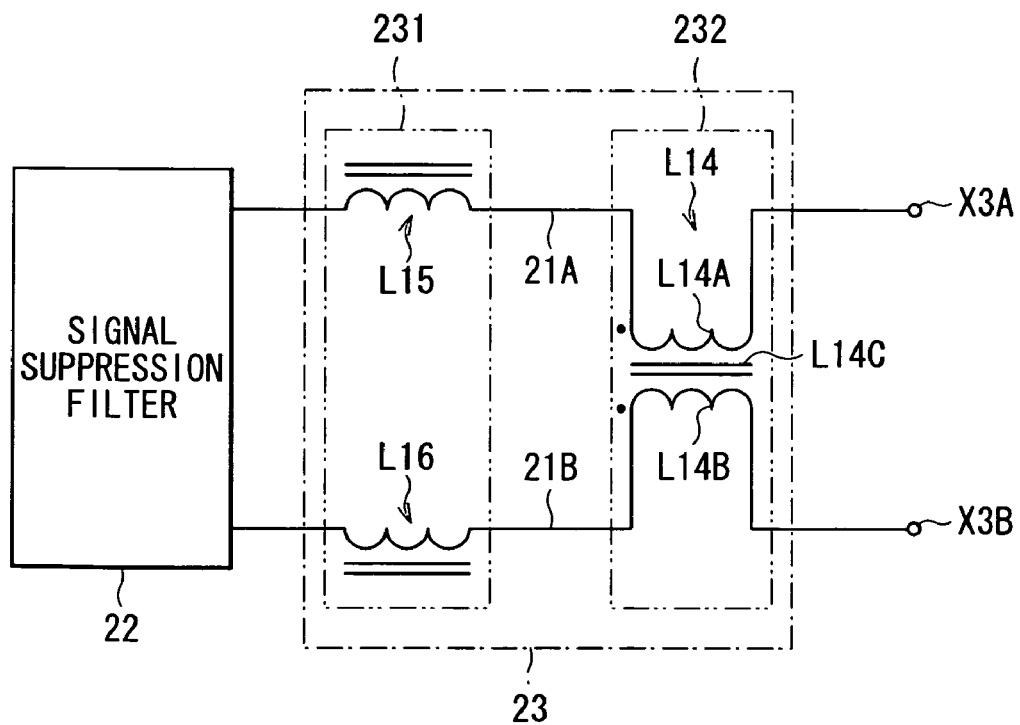
FIG. 4 is a circuit diagram showing a configuration of a signal separation filter in the signal detector shown in FIG. 1.

FIG. 4 shows an example of a circuit configuration of the signal separation filter 23. The signal separation filter 23 includes an impedance circuit 231 provided adjacently to the signal suppression filter 22 on the power lines 21A, 21B between the signal suppression filter 22 and the power output terminal T2, and an impedance circuit 232 provided on the power lines 21A, 21B between the impedance circuit 231 and the terminals X3A, X3B. The terminals X3A, X3B are terminals at a side near the power output terminal T2.

The impedance circuit 231 includes a winding L15 inserted into the power line 21A and a winding L16 inserted into the power line 21B, and exhibits high impedance to the normal mode signal. The impedance circuit 232 includes a winding L14A inserted into the power line 21A, a winding L14B inserted into the power line 21B, and an inductance element L14 including a core L14C. The winding L14A and the winding L14B are mutually coupled, and generate mutual inductance between the power lines 21A and 21B, and thus exhibit high impedance to the common mode signal. Here, the impedance circuits 231, 232 correspond to a specific example of the "first and second impedance elements" in the invention; the windings L15, L16 correspond to a specific example of the "fourth and fifth wincing coils" in the invention; and the inductance element L14 correspond to a specific example of the "third mutual-inductance element" in the invention.

Since the capacitor C13 and the capacitors C14, C15 are disposed in the signal suppression filter 22 as shown in FIG. 2, when the signal suppression filter 22 is connected to the power output terminal T2, signals (noise) generated by the device to be measured 3 are influence by the capacitors C13, C14 and C15 (that is, noise as a detection object is absorbed). Therefore, setting of the signal separation filter 23 is necessary.

The following relation is necessary for establishing signal separation to the power output terminal T2 (that is, device to be measured 3). Equation (1) is a condition necessary for separating the normal mode signal; and equation (2) is a condition necessary for separating the common mode signal.

$$Z(\omega \cdot L15 + \omega \cdot L16) \geqq 1/(\omega \cdot ([C13])) \tag{1}$$

$$Z(\omega \cdot L14A + \omega \cdot L14B) \geqq 1/(\omega \cdot ([C14]+[C15])) \tag{2}$$

In the equations, $Z(\omega \cdot L15 + \omega \cdot L16)$ is an impedance value due to the windings L15, L16, and $Z(\omega \cdot L14A + \omega \cdot L14B)$ is an impedance value due to the windings L14A, L14B. [C13], [C14] and [C15] are capacitance values of capacitors C13, C14 and C15, respectively. Moreover, $\omega = 2\pi f$ is given (f is frequency).

Figure 5:
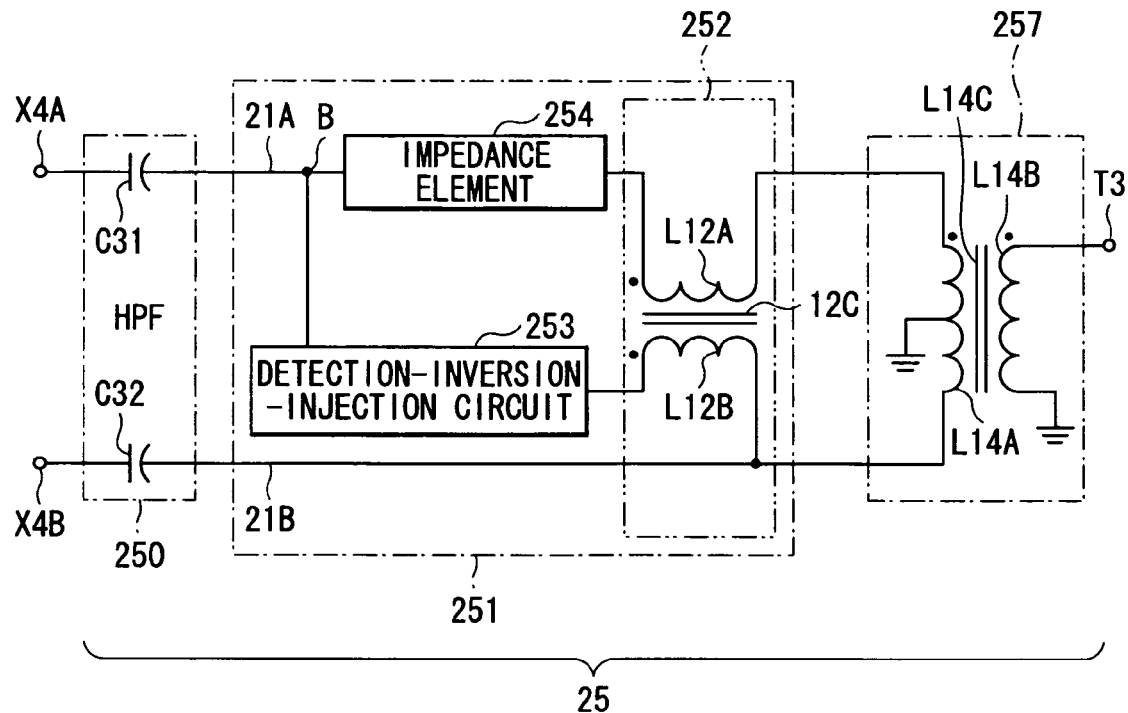
FIG. 5 is a function block diagram showing a configuration of a common-mode signal detection circuit in the signal detector shown in FIG. 1.
Figure 6:
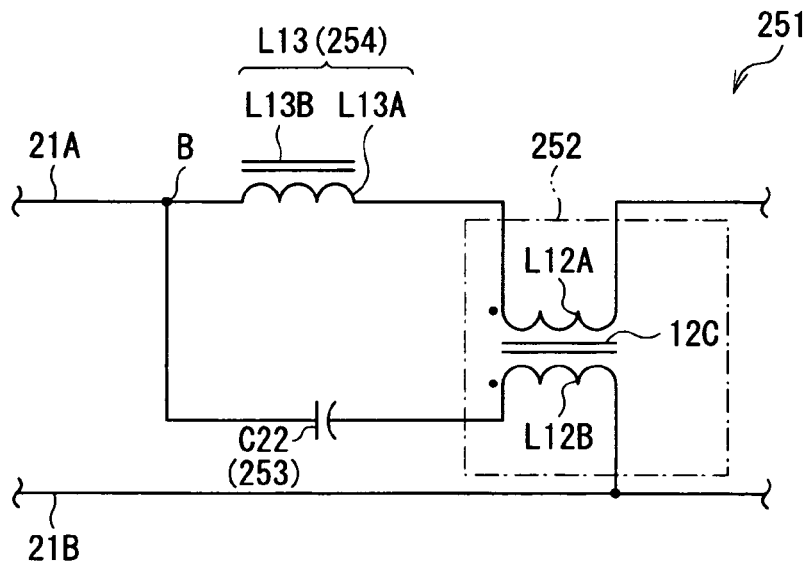
FIG. 6 is a circuit diagram showing a configuration of the common-mode signal detection circuit in the signal detector shown in FIG. 1.

FIG. 5 shows a circuit configuration of the common mode signal detection circuit 25; and FIG. 6 shows a specific example of a relevant part (normal-mode signal cancellation circuit) of the circuit configuration. The common-mode signal detection circuit 25 includes a high-pass filter 250, normal-mode signal cancellation circuit 251, and line transforming circuit 257 provided sequentially on the power lines 21A, 21B between terminals X4A, X4B at a side of the power output terminal T2 and the signal output terminal T3. Here, the high-pass filter 250 corresponds to a specific example of the "second high-pass filter" in the invention; and the normal-mode signal cancellation circuit 251 corresponds to a specific example of the "normal-mode signal cancellation circuit" in the invention.

The high-pass filter 250 is for transmitting a signal that is a high-frequency component transmitted over the power lines 21A, 21B and cutting off power voltage that is a low-frequency component, and includes capacitors C31, C32 inserted into the power lines 21A, 21B respectively, as shown in FIG. 5. The line transforming circuit 257 is for transforming a balanced line including the power lines 21A, 21B into an unbalanced line, and is configured to include a winding L14A that is connected to the power lines 21A, 21B at both ends respectively and grounded at the midpoint, a winding L14B that is grounded at one end and connected to the signal output terminal T3 at the other end, and a core L14C.

The normal-mode signal cancellation circuit 251 is for removing the normal mode signal from signals transmitted through the high-pass filter 250 and transmitting only the common mode signal, and includes an inductance element 252, a detection-inversion-injection circuit 253, and an impedance element 254. Here, the inductance element 252 corresponds to a specific example of the "third mutual-inductance element" in the invention, the impedance element 254 corresponds to a specific example of the "impedance element" in the invention, and the detection-inversion-injection circuit 253 corresponds to a specific example of the "detection-inversion-injection circuit" in the invention.

The inductance element 252 includes a winding L12A inserted into the power line 21A in a manner of being connected to a terminal X5A at one end, and a winding L12B connected to a terminal X5B at one end via the power line 21B, and a core 12C, and acts as a mutual inductance element that generates mutual inductance between the power lines 21A and 21B. The detection-inversion-injection circuit 253 is configured to include a capacitor C22 between one end B of the capacitor C31 of the high-pass filter 250 and the other end of the winding L12B, as shown in FIG. 6. The impedance element 254 includes an inductance element L13 including a winding L13A and a core L13C, the winding being inserted into the power line 21A between the one end B of the capacitor C31 and the other end of the winding L12A. Here, the windings L12A, L12B and L13A correspond to a specific example of the "fourth to sixth windings" in the invention.

The capacitor C22 corresponds to a specific example of the "third capacitor" in the invention.

In the normal-mode signal cancellation circuit 251 in such a configuration, the normal mode signal is detected from the power line 21A at an output side of the high-pass filter 250 and then inverted, and then injected into the winding L12B of the inductance element 252 to cancel the normal mode signal at a side of the winding L12A (side of the power line 21A), thereby the normal mode signal can be removed. The impedance element 254 is provided to attenuate the normal mode signal transmitted from the power line 21A to the winding L12A, and delay a phase of the signal such that phase difference to an inversion signal injected from the detection-inversion-injection circuit 253 into the winding L12B becomes easily 180 degrees.

Figure 7:
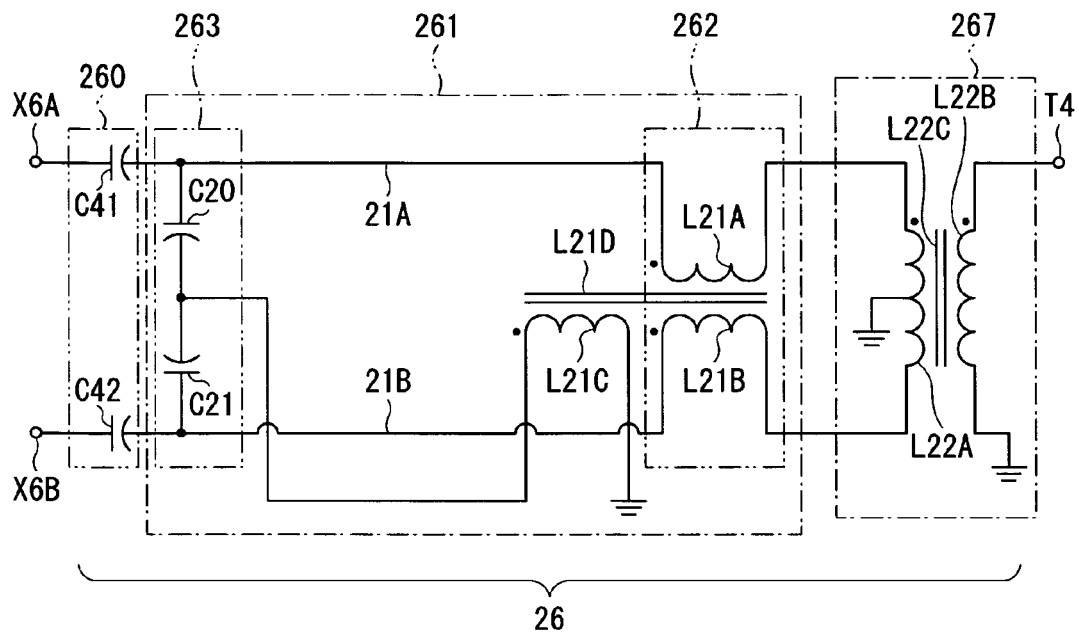
FIG. 7 is a circuit diagram showing a configuration of a normal-mode signal detection circuit in the signal detector shown in FIG. 1.

FIG. 7 shows a circuit configuration of the normal-mode signal detection circuit 26. The normal-mode signal detection circuit 26 includes a high-pass filter 260, common-mode signal cancellation circuit 261, and line transforming circuit 267 provided sequentially on the power lines 21A, 21B between terminals X6A, X6B at a side of the power output terminal T2 and terminals X7A, X7B at a side of the signal output terminal T4.

The high-pass filter 260 is for transmitting the signal that is the high-frequency component transmitted over the power lines 21A, 21B and cutting off the power voltage that is the low-frequency component, and includes capacitors C41, C42 inserted into the power lines 21A, 21B respectively. The line transforming circuit 267 has the same function as that of the line transforming circuit 257 (FIG. 5) included in the common-mode signal detection circuit 25. The circuit 267 is configured to include a winding L22A that is connected to the power lines 21A, 21B at both ends respectively and grounded at the midpoint, a winding L22B that is grounded at one end and connected to the signal output terminal T4 at the other end, and a core 22C. Here, the high-pass filter 260 corresponds to a specific example of the "first high-pass filter" in the invention; and the common-mode signal cancellation circuit 261 corresponds to a specific example of the "common-mode signal cancellation circuit" in the invention.

The common-mode signal cancellation circuit 261 is for removing the common mode signal from signals transmitted through the high-pass filter 260 and transmitting only the normal mode signal, and includes an inductance element 262, a detection-inversion circuit 263, and a winding L21C as an injection circuit. A basic configuration of the common-mode signal cancellation circuit 261 is the same as that of the common-mode signal cancellation circuit 221 in the signal suppression filter 22 as shown in FIG. 2 except that it does not have the inductance element 225. Here, the inductance element 262 corresponds to a specific example of the "first mutual-inductance element" in the invention, and the detection-inversion circuit 263 corresponds to a specific example of the "detection-inversion circuit" in the invention.

The inductance element 262 includes windings L21A, L21B inserted into the power lines 21A, 21B respectively, and a core L21D. One end of each of windings L21A, L21B is connected to each of terminals X7A, X7B. The detection-inversion circuit 263 includes capacitors C20, C21 connected in series between the power lines 21A, 21B. The winding L21C is wound in a manner of using the core L21D of the inductance element 262 in common, and connected to a mutual connection point of the capacitors C20, C21 at one end, and connected to ground at the other end. The winding L21C generates mutual inductance between the winding lines L21A and L21B. Here, each of the windings L21A, L21B and L21C correspond to a specific example of each of the "first, second and third windings" in the invention; and the winding L21C corresponds to a specific example of the "Injection circuit" in the invention. Each of the capacitors C20, C21 corresponds to a specific example of each of the "first and second capacitors" in the invention.

In the common-mode signal cancellation circuit 261 in such a configuration, the common mode signal transmitted over the power lines 21A, 21B at the output side of the high-pass filter 260 is detected and inverted by the detection-inversion circuit 263, and then injected into the windings L21A, L21B of the inductance element 262 via the winding L21C to cancel the common mode signals on the power lines 21A, 21B, thereby the common mode signal can be removed.

Next, operation of the signal detector in the configuration as above is described.

AC voltage from a not-shown power source is inputted from the power input terminal T1 to the signal detector 2, and led to the power output terminal T2 by a pair of power lines 21A, 21B and thus supplied to the device to be measured 3. At that time, the signal suppression filter 22 inhibits the high-frequency signals (signals including both of the common mode signal and the normal mode signal, so-called noise) contained in the power voltage inputted from the power input terminal T1, and transmits only the AC voltage component having the power supply frequency. Accordingly, clean AC voltage without including the high-frequency signals is supplied to the device to be measured 3, and the device to be measured 3 operates according to the AC voltage.

The device to be measured 3 generates high-frequency signals having various frequencies (signals including both the common mode signal and the normal mode signal, so-called noise) during operation. The high-frequency signals enter from the power output terminal T2 into the signal detector 2. Then, the signals are transmitted over the power lines 21A, 21B. At that time, the signal separation filter 23 prevents transmission of the high-frequency signals from the power output terminal T2 to the signal suppression filter 22. Thus, the high-frequency signals are prevented from being absorbed by the signal suppression filter 22 and thus decreased in level of the high-frequency signals as the detection object.

In response to closing of the switch S1, the common-mode signal detection circuit 25 inhibits the normal mode signal among high-frequency signals on the power lines 21A, 21B entering from the power output terminal T2, and extracts only the common mode signal and output it from the signal output terminal T3. In response to closing of the switch S2, the normal-mode signal detection circuit 26 inhibits the common mode signal among the high-frequency signals on the power lines 21A, 21B entering from the power output terminal T2, and extracts only the normal mode signal and outputs it from the signal output terminal T4. From the signal output terminal T5, the mixed signal of the common mode signal and the normal mode signals on the power lines 21A, 21B entering from the power output terminal T2 is outputted in a state that both the switches S1 and S2 are opened.

When the common mode signal is detected, the switch S2 is preferably in an off-state (open). This is because if the switch S2 is remained in an on-state (connection), the common mode signal as the detection object is inputted also into the normal-mode signal detection circuit 26 and removed there, as a result, a detection level of the common mode signal in the common-mode signal detection circuit 25 is decreased. Similarly, when the normal mode signal is detected, the switch S1 is preferably in an off-state. This is because if the switch S1 is remained in an on-state, the normal mode signal as the detection object is inputted also into the common-mode signal detection circuit 25 and removed by the circuit, as a result, a detection level of the normal mode signal in the normal-mode signal detection circuit 26 is decreased. For the similar reason, in the case that the mixed signal of the common mode signal and the normal mode signal is detected from the signal output terminal T4, both the switches S1, S2 are in the off-state as above.

However, when the common mode signal is detected, detection of the common mode signal is not necessarily difficult by the common-mode signal detection circuit 25 even if the switch S2 is in the on-state. In addition, when the normal mode signal is detected, detection of the normal mode signal is not necessarily difficult by the normal-mode signal detection circuit 26 even if the switch S1 is in the on-state. When the mixed signal of the common mode signal and the normal mode signal is detected from the signal output terminal T4, detection of the mixed signal is not necessarily difficult even if at least one of the switches S1 and S2 is in the on-state. In any of the cases, while a detection level is decreased, frequency distribution, that is, which frequency band a signal exists in can be known, or a relative level of a signal can be known for each frequency.

Next, operation of each part is described.

The signal suppression filter 22 shown in FIG. 2 operates as follows.

In the common-mode signal cancellation circuit 221 of the signal suppression filter 22, the common mode signal transmitted over the power lines 21A, 21B from the terminals X1A, X1B is detected and inverted by the detection-inversion circuit 224, and then injected into the windings L11A, L11B of the inductance element 226 via the winding L11C to cancel the common mode signals on the power lines 21A, 21B, thereby the common mode signal is removed. Since the inductance element 225 as the impedance element to the common mode signal is disposed between the detection-inversion circuit 224 and the inductance element 226, the common mode signal can be attenuated more effectively, and delayed in phase such that phase difference to the inversion signal injected from the detection-inversion circuit 224 into the winding L11C becomes easily 180 degrees.

In the normal-mode signal inhibition circuit 222, the capacitors C12, C13 act as the n-type normal-mode filter in cooperation with leakage inductance of the inductance elements 225, 226 to inhibit the normal mode signal.

In the common-mode signal inhibition circuit 223, the capacitors C14, C15 cooperate with each other to inhibit the common mode signal particularly in the high frequency band. Therefore, even if the common mode signal in the high frequency band may not be fully inhibited in the common-mode signal cancellation circuit 221, since the signal is inhibited by the common-mode signal inhibition circuit 223 at the latter stage, the common mode signal can be inhibited in a wide band.

Figure 11:
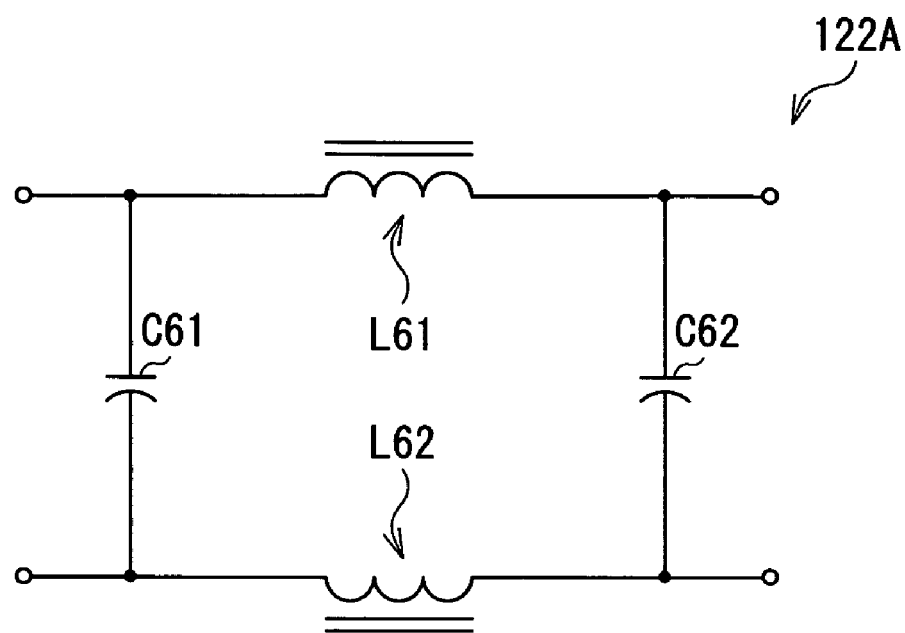
FIG. 11 is a circuit diagram showing a configuration of a normal-mode signal suppression filter according to a comparative example.
Figure 12:
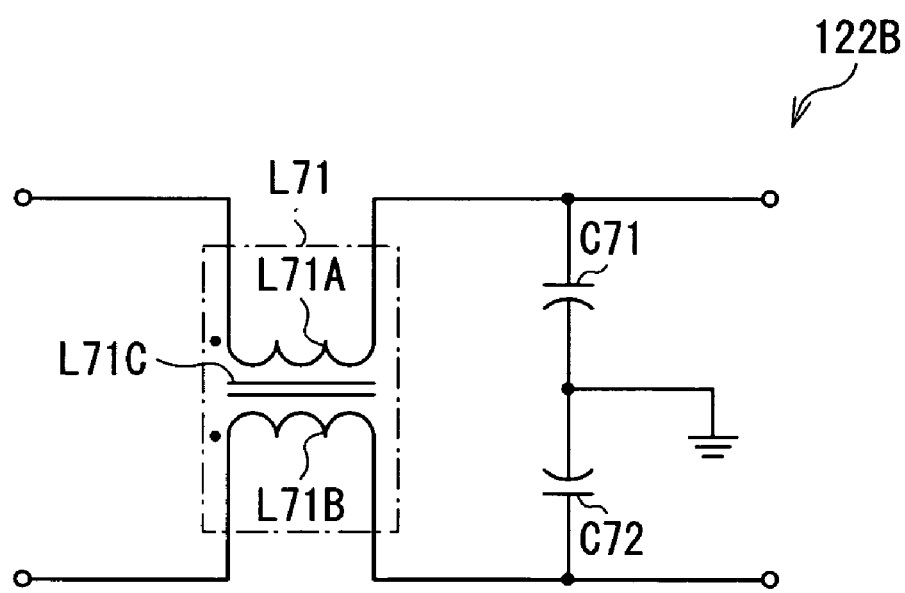
FIG. 12 is a circuit diagram showing a configuration of a common-mode signal suppression filter according to a comparative example.

In this way, the signal suppression filter 22 of the embodiment can inhibit a signal in a wide band compared with a case, for example, using a typical normal-mode signal suppression filter 122A as shown in FIG. 11 or a typical common-mode signal suppression filter 122B as shown in FIG. 12. The reason for this is as follows: while each of the filters shown in FIG. 11 and FIG. 12 has large frequency dependence because it uses LC resonance, the signal suppression filter 22 of the embodiment uses the common-mode signal cancellation circuit 221 that inhibits a signal by canceling a common mode signal by an inversion signal of it, basically irrespective of frequency.

Figure 19:
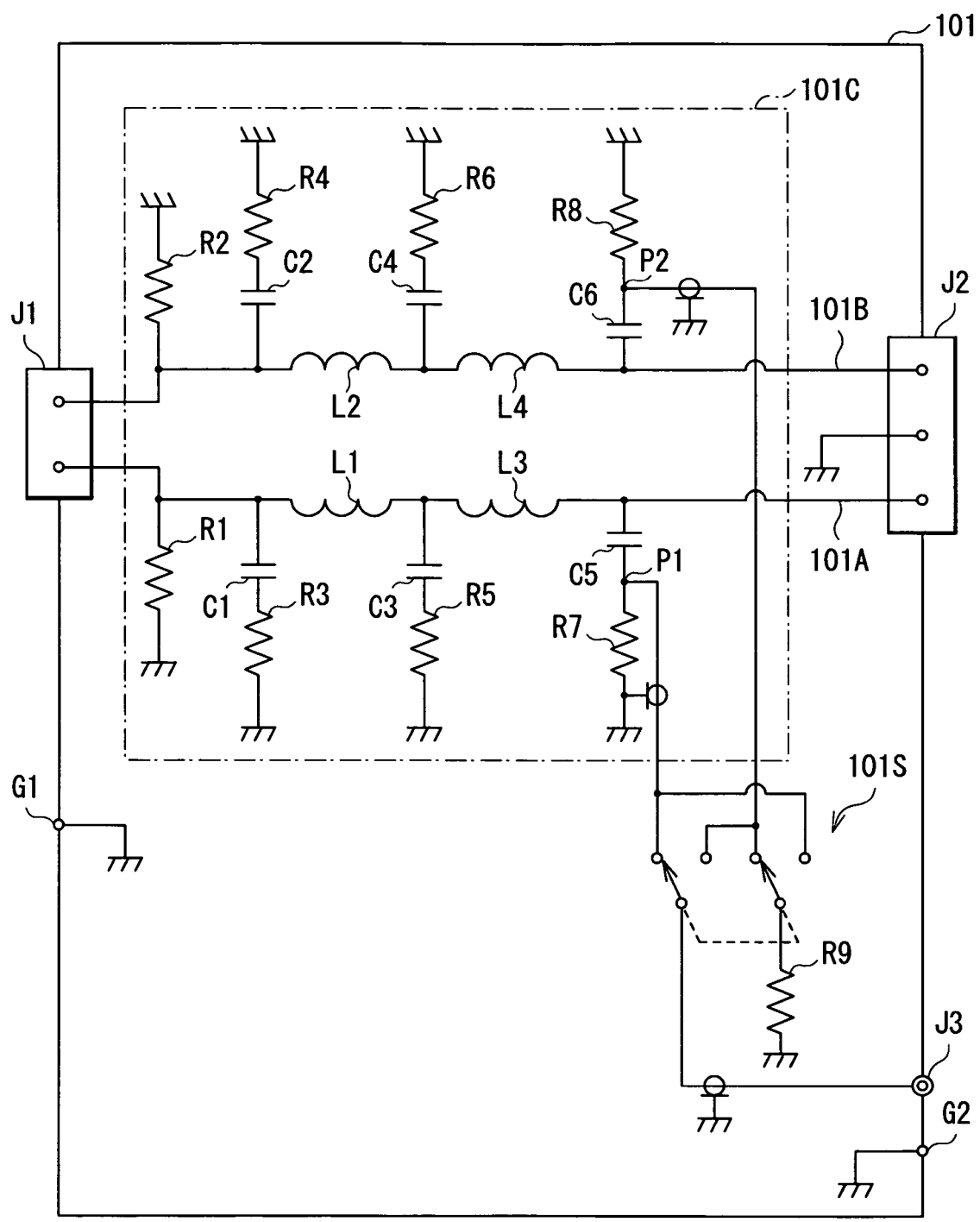
FIG. 19 is a block diagram showing a configuration of the measuring device shown in FIG. 18.

If the LC filters shown in FIG. 11, FIG. 12 are used to obtain a characteristic of signal inhibition in a wide band, since a large air-core coil is necessarily used similarly to the case of FIG. 19 described as the example of the related art, the signal detector is considered to be significantly increased in size. On the contrary, in the signal suppression filter 22 of the embodiment, since the common-mode signal cancellation circuit 221 is not formed by the LC resonance circuit, a ferrite core can be used for the cores L10C and L11D of the inductance elements 225 and 226, consequently decrease in size of the signal detector can be achieved while the signal inhibition characteristic is secured in the wide band.

The normal-mode signal suppression filter 122A shown in FIG. 11 includes inductance elements L61, L62 inserted into power lines 21A, 21B respectively, and capacitors C61, C62 provided between power lines 21A, 21B in positions at both sides of the inductance elements L61, L62. The common-mode signal suppression filter 122B shown in FIG. 12 includes a mutual inductance element L71 including windings L71A, L71B inserted into the power lines 21A, 21B respectively and a core L71C, and capacitors C71, C72 connected in series between the power lines 21A, 21B.

The signal separation filter 23 shown in FIG. 4 operates as follows.

In the signal separation filter 23, the impedance circuit 231 satisfies the equation (1), thereby it exhibits high impedance to the normal mode signal; and the impedance circuit 232 satisfies the equation (2), thereby it exhibits high impedance to the common mode signal. As a result, the high-frequency signals including the common mode signal and the normal mode signal generated by the device to be measured 3 can be prevented from being absorbed by the capacitors C13, C14 and C15 in the signal suppression filter 22.

The common-mode signal detection circuit 25 shown in FIG. 5 and FIG. 6 operates as follows.

In the common-mode signal detection circuit 25, the high-pass filter 250 transmits the signals that are the high-frequency component transmitted over the power lines 21A, 21B and blocks the power voltage that is the low-frequency component. The normal-mode signal cancellation circuit 251 removes the normal mode signal from the signals transmitted through the high-pass filter 250 and transmits only the common mode signal. More specifically, the detection-inversion-injection circuit 253 (capacitor C22) detects the normal mode signal from the power line 21A at the output side of the high-pass filter 250 and then inverts it, and then injects the signal into the winding L12B of the inductance element 252 to cancel the normal mode signal at the side of the winding L12A (side of the power line 21A), thereby the normal mode signal is removed. At that time, the impedance element 254 (inductance element L13) acts to attenuate the normal mode signal transmitted from the power line 21A to the winding L12A, and delay a phase of the signal such that the phase difference to the inversion signal injected from the detection-inversion-injection circuit 253 into the winding L12B is 180 degrees, therefore the signals can be sufficiently cancelled by each other.

In the common-mode signal detection circuit 25, since a power frequency component is decoupled by the high-pass filter 250 at the former stage, a circuit at a latter stage can be designed only in consideration of removal of the high-frequency signal (normal mode signal) Therefore, the ferrite core can be used for the core L12C of the inductance element 252, consequently reduction in size of the circuit can be achieved compared with the normal-mode signal suppression filter 122A shown in FIG. 11.

The normal-mode signal detection circuit 26 shown in FIG. 7 operates as follows.

In the normal-mode signal detection circuit 26, the high-pass filter 260 transmits the signals that are the high-frequency component transmitted over the power lines 21A, 21B and blocks the power voltage that is the low-frequency component. The common-mode signal cancellation circuit 261 removes the common mode signal from the signals transmitted through the high-pass filter 260 and transmits only the normal mode signal. More specifically, the detection-inversion-injection circuit 263 detects and inverts the common mode signal transmitted over the power lines 21A, 21B at the output side of the high-pass filter 260, and then injects the signal into the windings L21A, L21B of the inductance element 262 via the winding L21C to cancel the common mode signals over the power lines 21A, 21B, thereby the common mode signal is removed.

In the normal-mode signal detection circuit 26, since a power frequency component is decoupled by the high-pass filter 260 at the former stage, a circuit at a latter stage can be designed only in consideration of removal of the high-frequency signal (common mode signal) Therefore, the ferrite core can be used for the core L21D of the inductance element 262, consequently reduction in size of the circuit can be achieved compared with the common-mode signal suppression filter 122B shown in FIG. 12.

Next, signal detection performance of the signal detector of the embodiment is described with reference to FIG. 13 to FIG. 17.

Figure 13:
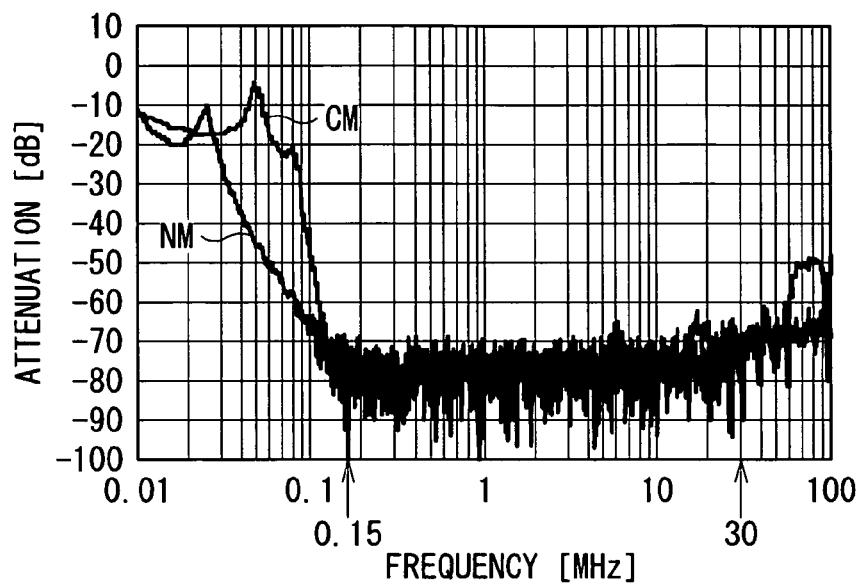
FIG. 13 is a characteristic diagram showing an example of a characteristic of the signal suppression filter used in the signal detector of the embodiment.

FIG. 13 shows an example of a characteristic of the signal suppression filter 22. The horizontal axis represents frequency [MHz], and the vertical axis represents attenuation [dB]. As is obvious from the figure, attenuation of 60 dB or more is found in both of the common mode signal (symbol CM) and the normal mode signal (symbol NM) in a frequency band of 150 KHz to 30 MHz, which shows that noise of power supply source can be inhibited.

Figure 14:
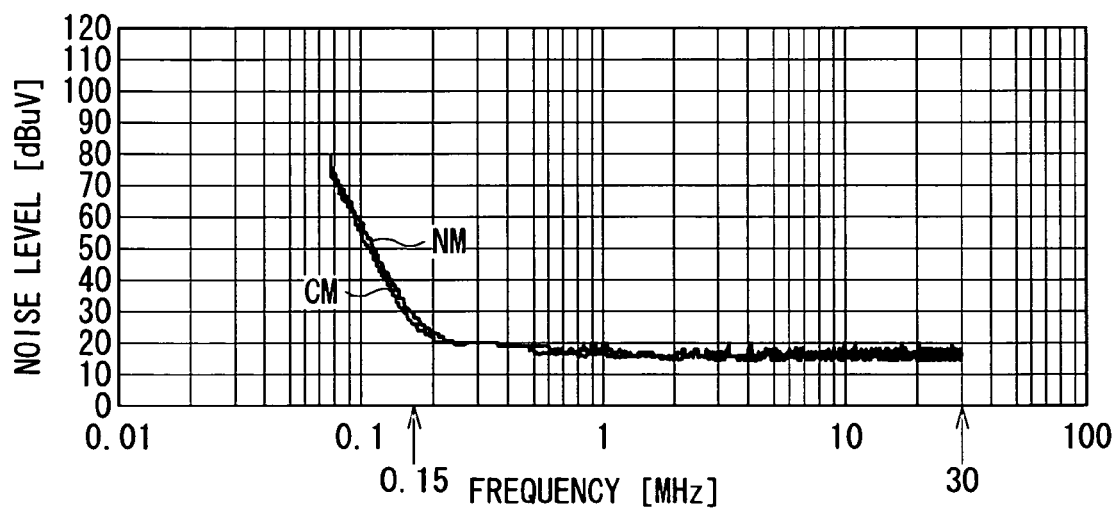
FIG. 14 is a diagram showing a measurement result of dark noise in the signal detector of the embodiment.

FIG. 14 shows a measurement result of dark noise (that is, noise in an unconnected condition of the device to be measured 3) in the case that the signal detector 2 of the embodiment is set in a typical measurement environment rather than the radio wave anechoic chamber. The horizontal axis represents frequency [MHz], and the vertical axis represents a noise level [dBμV]. As is obvious from the figure, the noise level is 30 dBβV or lower in both of the common mode signal (symbol CM) and the normal mode signal (symbol NM) in the frequency band of 150 KHz to 30 MHz. Accordingly, an environment in which noise terminal voltage can be sufficiently measured is considered to be given although it is portable.

Figure 15:
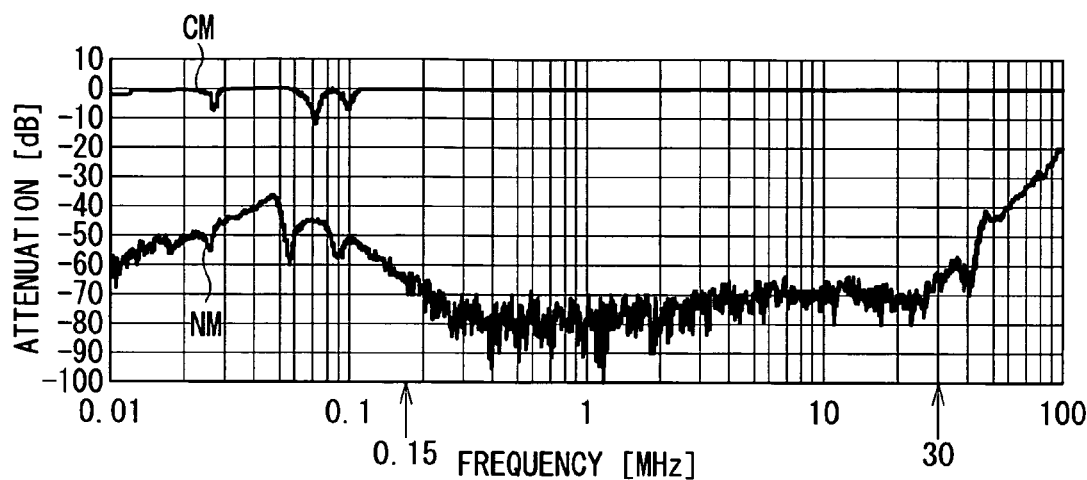
FIG. 15 is a diagram showing a measurement result of a common mode signal appearing at a signal output terminal when both of a normal mode signal and a common mode signal are applied to a power output terminal.

FIG. 15 shows a measurement result in the case that when the device to be measured 3 is assumed to generate noise, and both of the common mode signal and the normal mode signal are applied from the noise source to the power output terminal T2, a level (attenuation) of the common mode signal appearing at the signal output terminal T3 is measured. The horizontal axis represents frequency [MHz], and the vertical axis represents attenuation [dB]. In the frequency band of 150 KHz to 30 MHz, the common mode signal (symbol CM) is transmitted without attenuation, however, the normal mode signal (symbol NM) exhibits attenuation of 60 dB. This shows that practically sufficient mode separation is achieved.

Figure 16:
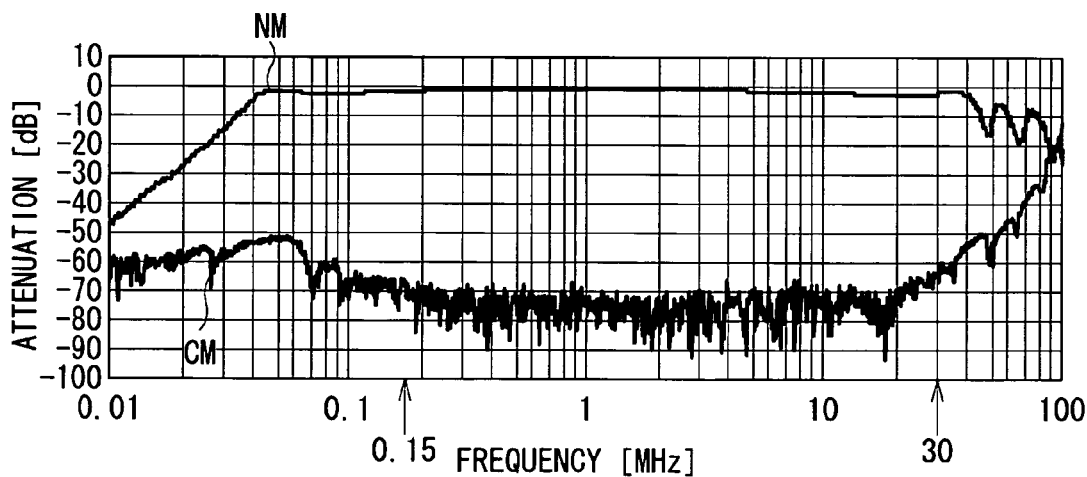
FIG. 16 is a-diagram showing a measurement result of a normal mode signal appearing at a signal output terminal when both of the normal mode signal and the common mode signal are applied to the power output terminal.

FIG. 16 shows a measurement result in the case that when the device to be measured 3 is assumed to generate noise, and both of the common mode signal and the normal mode signal are applied from the noise source to the power output terminal T2, a signal level (attenuation) appearing at the signal output terminal T4 is measured. The horizontal axis represents frequency [MHz], and the vertical axis represents attenuation [dB]. In the frequency band of 150 KHz to 30 MHz, the normal mode signal (symbol NM) is transmitted without attenuation, however the common mode signal (symbol CM) exhibits attenuation of 60 dB. This shows that practically sufficient mode separation is achieved.

Figure 17:
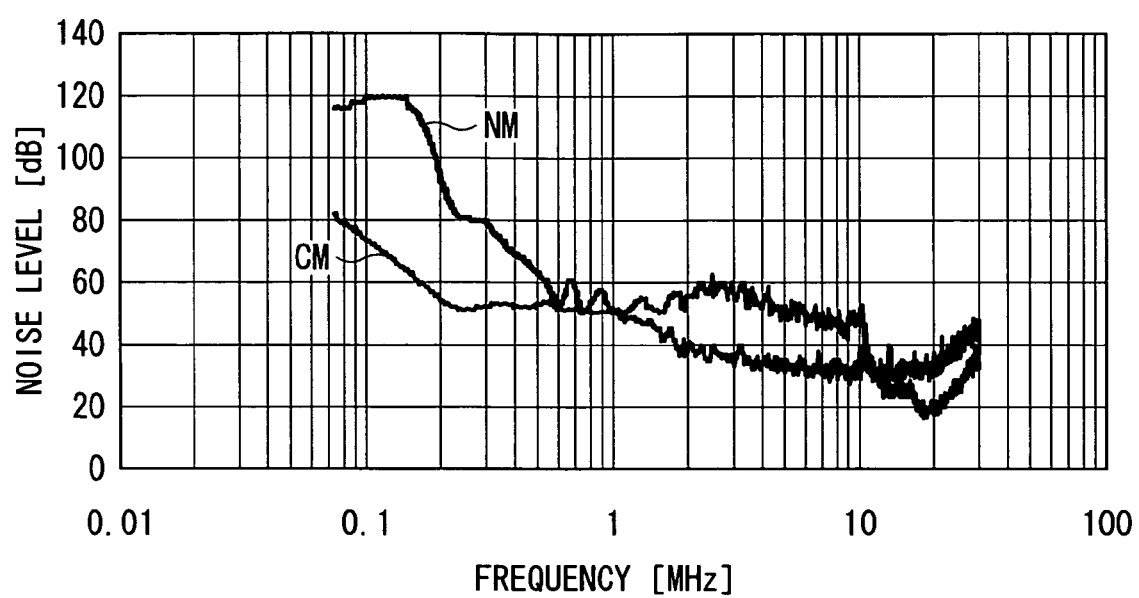
FIG. 17 is a diagram showing a measurement result when high-frequency waves (the common mode signal and the normal mode signal)generated from a cleaner as an example of a device to be measured are measured using the signal detector of the embodiment.
Figure 18:
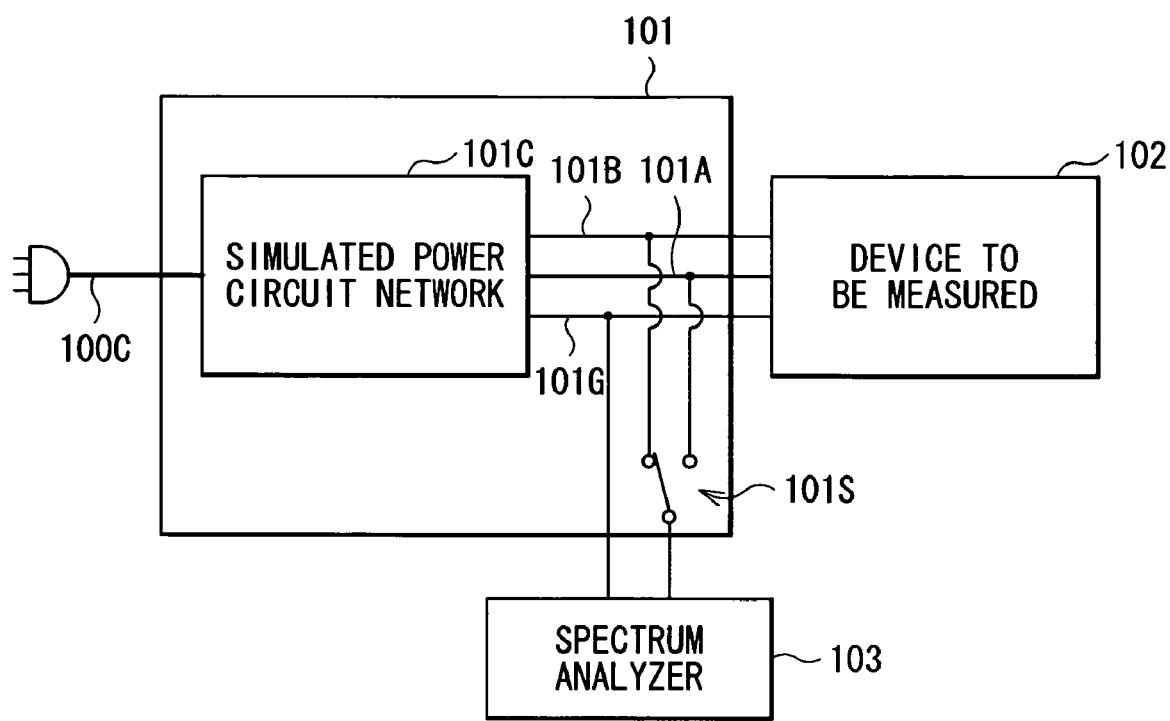
FIG. 18 is a block diagram showing a configuration of a noise-terminal-voltage measurement system in the related art.

FIG. 17 shows a measurement result in the case that when a vacuum cleaner is used as an example of the device to be measured 3, and the common mode signal and the normal mode signal are measured using the signal detector of the embodiment. The horizontal axis represents frequency [MHz], and the vertical axis represents a signal level [dB]. From the figure, it is known that noise generation is different depending on a frequency band, and therefore found that a measure should be taken by engineers of research and development. That is, the signal detector of the embodiment can sufficiently exhibit functions as a development tool that is compact, mobile, and useful.

As described hereinbefore, according to the embodiment, the signal suppression filter 22 that inhibits the high-frequency signals contained in the power voltage and the signal separation filter 23 that prevents transmission of the high-frequency signals are provided in series on the power lines 21A, 21B connected to the power input terminal T1, and the high-frequency signals contained in the power voltage are outputted from the signal output terminals T3 to T5. Accordingly, the high-frequency signals contained in the power voltage can be securely blocked by a signal blocking circuit in a two-stage configuration of the signal suppression filter 22 and the signal separation filter 23. That is, signal block performance is improved compared with a case of using only one of the signal suppression filter 22 and the signal separation filter 23. Therefore, influence of power noise on a measurement system can be eliminated.

Moreover, since the signal separation filter 23 that prevents transmission of the high-frequency signal is provided between the signal suppression filter 22 and the power output terminal T2, the high-frequency signals generated by the device to be measured 3 can be prevented from being absorbed by the signal suppression filter 22, consequently decrease in signal detection level at the signal output terminals T3 to T5 can be prevented.

Moreover, since the signal suppression filter 22 is configured in a way of including the common-mode signal cancellation circuit 221 as a relevant part of common-mode signal inhibition means, reduction in size of a circuit and thus a signal detector can be achieved compared with a case of configuring the common-mode signal inhibition means using the LC resonance.

Furthermore, since the common-mode signal inhibition circuit 223 that can effectively inhibits the common mode signal particularly in a high-frequency band is provided at the latter stage of the common-mode signal cancellation circuit 221, the common mode signal can be inhibited in a wider band.

Furthermore, the common-mode signal detection circuit 25 and the normal-mode signal detection circuit 26 are provided separately from each other, the common mode signal and the normal mode signal can be detected separately. Furthermore, since the switches S1 and S2 are provided at input ends of the common-mode signal detection circuit 25 and the normal-mode signal detection circuit 26 respectively, when one of the common mode signal and the normal mode signal is measured by one of the detection circuits, a measurement value is not influenced by the other detection circuit for measuring the other signal; consequently an accurate value can be obtained.

Modification 1

Figure 8:
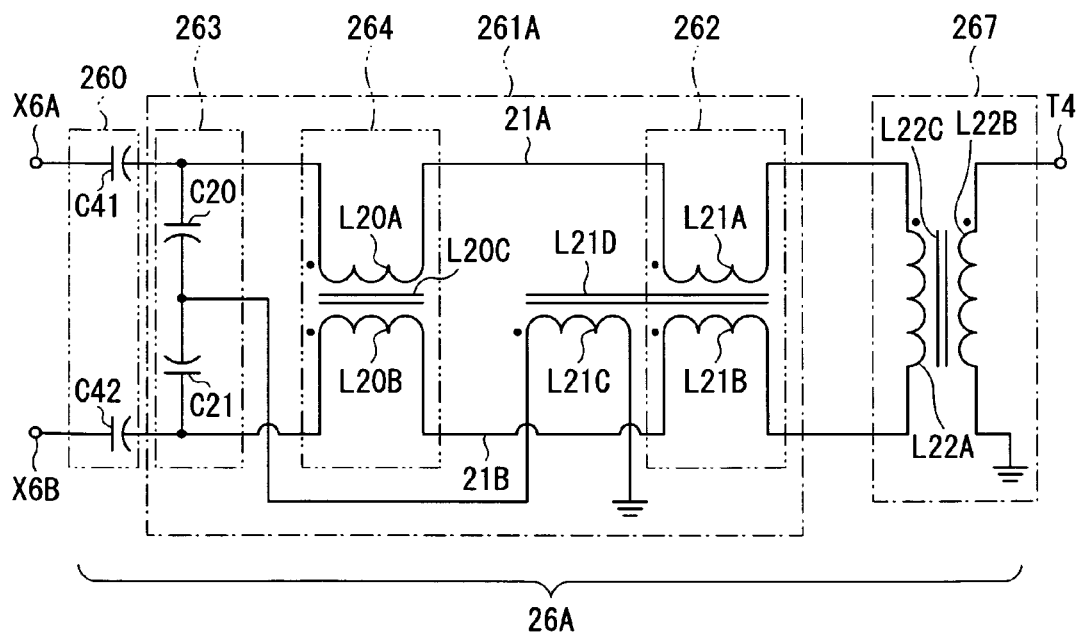
FIG. 8 is a circuit diagram showing a modification of the normal-mode signal detection circuit.

A modification can be made, in which a normal-mode signal detection circuit 26A as shown in FIG. 8 is used instead of the normal-mode signal detection circuit 26 shown in FIG. 7. The normal-mode signal detection circuit 26A is made to have a configuration similar to that of the common-mode signal cancellation circuit 221 as shown in FIG. 2 by adding an inductance element 264 to a latter stage (side of the terminals X7A, X7B) of the detection-inversion circuit 263 in the common-mode signal cancellation circuit 261 in FIG. 7. The inductance element 264 is the same element as the inductance element 225 in FIG. 2, and includes a winding L10A inserted into a power line 21A, a winding L10B inserted into a power line 21B, and a core L10C. Other configuration is the same as in the case of FIG. 7. Here, a common-mode signal cancellation circuit 261A corresponds to another specific example of the "common-mode signal cancellation circuit" in the invention; and the inductance element 264 corresponds to another specific example of the "second mutual inductance element" in the invention.

In the modification, the inductance element 264 generates mutual inductance between the power lines 21A and 21B, so that impedance to the common mode signal is increased. Therefore, the common mode signal can be attenuated more effectively and delayed in phase such that phase difference to an inversion signal injected from a detection-inversion circuit 263 into a winding core L21C is 180 degrees.

Modification 2

Figure 9:
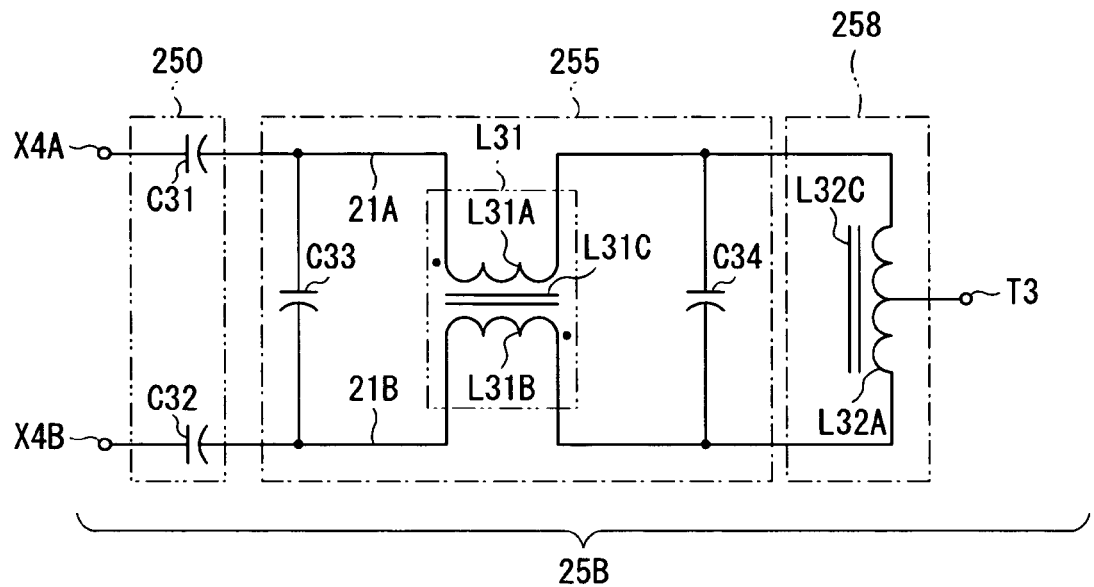
FIG. 9 is a circuit diagram showing a modification of the common-mode signal detection circuit.

Moreover a modification can be made, in which a common-mode signal detection circuit 25B as shown in FIG. 9 is used instead of the common-mode signal detection circuit 25 shown in FIG. 5. The common-mode signal detection circuit 25B has a normal-mode signal inhibition circuit 255 instead of the normal-mode signal cancellation circuit 251 in the common-mode signal detection circuit 25 of FIG. 5, and has a line transforming circuit 258 instead of the line transforming circuit 257.

The normal-mode signal inhibition circuit 255 includes a capacitor C33, an inductance element L31, and a capacitor C34 in order from a side near a high-pass filter 250 on power lines 21A, 21B at an output side of the high-pass filter 250. The capacitor C33 is connected between the power lines 21A, 21B. The inductance element L31 is configured by winding cores L31A, L31B inserted into the power lines 21A, 21B respectively and a core L31C. The capacitor C33 and the inductance element L31 cooperate with each other to configure a first-stage LC filter. The capacitor C34 is connected between the power lines 21A, 21B. The capacitor C34 and the inductance element L32 cooperate with each other to configure a second-stage LC filter. That is, the common-mode signal detection circuit 25B functions as an LC filter in a two-stage configuration. The line transforming circuit 258 is configured to include a winding L32A connected to the power lines 21A, 21B at two ends respectively and a core L32C. The midpoint of the winding L32A is connected to a signal output terminal T3.

In the common-mode signal detection circuit 25B in such a configuration, the high-pass filter 250 blocks power supply frequency, and transmits a mixed signal of a common mode signal and a normal mode signal. The common-mode signal detection circuit 25B inhibits only the normal mode signal in the mixed signal, and the line transforming circuit 258 transforms a balanced line into an unbalanced line. Thus, only the common mode signal appears at a signal output terminal T3.

Modification 3

Figure 10:
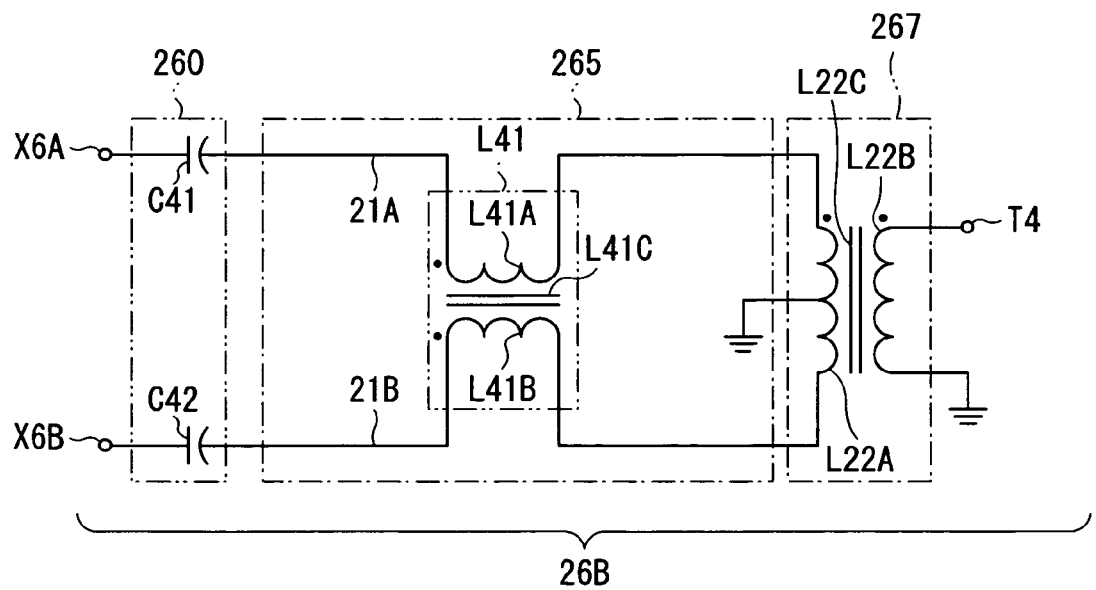
FIG. 10 is a circuit diagram showing another modification of the normal-mode signal detection circuit.

Furthermore, a modification can be made, in which a normal-mode signal detection circuit 26B as shown in FIG. 10 is used instead of the normal-mode signal detection circuit 26 shown in FIG. 7. The normal-mode signal detection circuit 26B has a common-mode signal inhibition circuit 265 instead of the common-mode signal cancellation circuit 261 in the normal-mode signal detection circuit 26 of FIG. 7. Other configuration is the same as in the normal-mode signal detection circuit 26 of FIG. 7.

The common-mode signal inhibition circuit 265 has an inductance element L41 on power lines 21A, 21B at an output side of a high-pass filter 260. The inductance element L41 is configured to include winding cores L41A, L41B inserted into the power lines 21A, 21B respectively and a core L41C.

In the normal-mode signal detection circuit 26B in such a configuration, the high-pass filter 260 blocks power supply frequency, and transmits a mixed signal of a common mode signal and a normal mode signal. The common-mode signal inhibition circuit 265 selectively removes only the common mode signal from the mixed signal. Thus, only the normal mode signal appears at a signal output terminal T4.

Hereinbefore, while the invention has been described with embodiments and examples, the invention is not limited to those, and various modifications can be made. For example, while the signal output terminal T5 for outputting the mixed signal was provided in addition to the signal output terminals T3 and T4, it needs not be necessarily provided, and may be omitted.

The invention claimed is:

1. A signal detector comprising:
   a power input terminal supplied with power voltage from a power supply source;
   a power output terminal connected to a device to be measured, and outputting the power voltage inputted from the power input terminal to the device to be measured;
   a signal blocking circuit provided on first and second conductive lines connected to the power input terminal, and blocking transmission of a signal between the power input terminal and the power output terminal;
   a common-mode signal detection circuit extracting a common mode signal from signals contained in the power voltage between the power output terminal and the signal blocking circuit;
   a normal-mode signal detection circuit extracting a normal mode signal from the signals contained in the power voltage between the power output terminal and the signal blocking circuit;
   a common-mode signal output terminal provided at an output end of the common-mode signal detection circuit; and
   a normal-mode signal output terminal provided at an output end of the normal-mode signal detection circuit.

2. The signal detector according to claim 1 further comprising:
   a first switch provided at an input end of the common-mode signal detection circuit; and
   a second switch provided at an input end of the normal-mode signal detection circuit.

3. The signal detector according to claim 2 further comprising:
   a mixed-signal output terminal outputting the common mode signal and the normal mode signal contained in the power voltage between the power output terminal and the signal blocking circuit in a mixed condition.

4. The signal detector according to claim 1, wherein the normal-mode signal detection circuit is configured to include:
a first high-pass filter blocking the power voltage; and
a common-mode signal cancellation circuit removing the common mode signal from signals transmitted through the high-pass filter.

5. The signal detector according to claim 4, wherein the common-mode signal cancellation circuit is configured to include:
a first mutual-inductance element provided between the first and second conductive lines and generating mutual inductance between the first and second conductive lines;
a detection-inversion circuit provided between the first and second conductive lines, the detection-inversion circuit detecting the common mode signal contained in the power voltage inputted from the power input terminal and inverting a phase of the common mode signal detected; and
an injection circuit injecting an inversion signal into the first mutual-inductance element, a phase of the inversion signal having been inverted by the detection-inversion circuit.

6. The signal detector according to claim 5, wherein the first mutual-inductance element is configured to include a first winding inserted into the first conductive line, and a second winding inserted into the second conductive line and coupled with the first winding,
the injection circuit is configured to include a third winding coupled with the first mutual-inductance element such that mutual inductance is generated between the third winding and the first mutual-inductance element,
the detection-inversion circuit is configured to include first and second capacitors connected in series between the first and second conductive lines, and
the third winding is connected to a mutual connection point between the first and second capacitors at one end and connected to ground at the other end.

7. The signal detector according to claim 5, wherein the common-mode signal cancellation circuit further includes a second mutual-inductance element on first and second conductive lines between the detection-inversion circuit and the injection circuit, the second mutual-inductance element acting as an impedance element to the common mode signal.

8. The signal detector according to claim 1, wherein the common-mode signal detection circuit is configured to include:
a second high-pass filter that transmits only signals; and
a normal-mode signal cancellation circuit that removes the normal mode signal from signals transmitted through the high-pass filter.

9. The signal detector according to claim 8, wherein the normal-mode signal cancellation circuit is configured to include:
a third mutual-inductance element provided on the first and second conductive lines and generating mutual inductance between the first and second conductive lines;
a detection-inversion-injection circuit connected to the first conductive line, the detection-inversion-injection circuit detecting the normal mode signal contained in the power voltage on the first conductive line, inverting a phase of the normal mode signal detected and injecting an inversion signal, a phase of which has been inverted, into the first conductive line via the third mutual-inductance element; and
an impedance element provided on the first conductive line between a connection point of the detection-inversion-injection circuit to the first conductive line and the third mutual-inductance element, and reducing a crest value of the normal mode signal.

10. The signal detector according to claim 9, wherein the third mutual-inductance element is configured to include a fourth winding inserted into the first conductive line, and a fifth winding connected to the second conductive line at one end and mutually coupled with the fourth winding,
the detection-inversion-injection circuit is configured to include a third capacitor connected between the first conductive line and the other end of the fifth winding, and
the impedance element is configured to include a sixth winding inserted into the first conductive line.

* * * * *